(12) United States Patent
Ochiai et al.

(10) Patent No.: US 6,258,507 B1
(45) Date of Patent: Jul. 10, 2001

(54) PHOTORESIST COMPOSITIONS

(75) Inventors: Koshiro Ochiai; Nobuhito Fukui, both of Toyonaka (JP)

(73) Assignee: Sumitomo Chemical Company, Limited, Osaka (JP)

( * ) Notice: Subject to any disclaimer, the term of this patent is extended or adjusted under 35 U.S.C. 154(b) by 0 days.

(21) Appl. No.: 09/276,715

(22) Filed: Mar. 26, 1999

(30) Foreign Application Priority Data

Mar. 26, 1998 (JP) .................................................. 10-079033

(51) Int. Cl.$^7$ ............................. G03C 1/73; C08F 24/00; C08F 18/16; C08F 16/12
(52) U.S. Cl. ..................................... 430/270.1; 430/287.1; 430/326; 430/905; 430/914; 526/270; 526/326; 526/333
(58) Field of Search ..................................... 526/270, 326, 526/333; 430/270.1, 285.1, 287.1, 908, 905, 326, 914

(56) References Cited

U.S. PATENT DOCUMENTS

| 3,794,608 | * | 2/1974 | Evani et al. ........................... 526/333 |
| 3,882,084 | * | 5/1975 | Tato et al. ............................. 526/245 |
| 3,931,248 | * | 1/1976 | Maekawa et al. .................... 526/270 |

FOREIGN PATENT DOCUMENTS

| 206518 | 1/1984 | (DD) . |
| 0634696A1 | 1/1995 | (EP) . |
| 0691575 A2 | * 1/1996 | (EP) . |
| 0691575A3 | 10/1996 | (EP) . |
| 0780732A2 | 6/1997 | (EP) . |
| 0780732A3 | 6/1997 | (EP) . |
| 2119942A | 11/1983 | (GB) . |
| 56-122028 | 9/1981 | (JP) . |
| 56-150741 | 11/1981 | (JP) . |
| 58-49940 | 3/1983 | (JP) . |

OTHER PUBLICATIONS

Maso Kato et al—"Novel Synthesis of Photocrosslinkable Polymers" Journal of Polymer Science, Part A–1, vol. 9, 1971, pp. 2109–2128, XP002130275, table 1, p. 2126, line 16–30.
XP002130276 & JP 59 034532 A (Mitsubishi Chem Ind LTD), 2–24–84 abstract.

* cited by examiner

Primary Examiner—Hoa Van Le
Assistant Examiner—Sin J. Lee
(74) Attorney, Agent, or Firm—Birch, Stewart, Kolasch & Birch, LLP

(57) ABSTRACT

A photoresist composition which is particularly useful as a chemical amplification type photoresist is provided, wherein the photoresist composition contains a resin having a structural unit represented by the following formula (I):

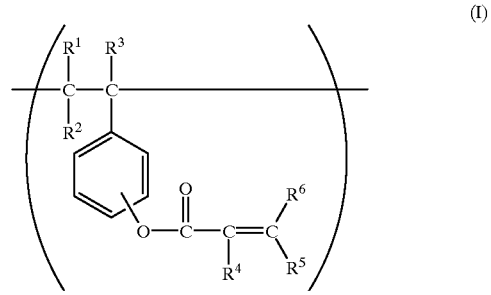

wherein $R^1$, $R^2$ ad $R^3$ each independently represents a hydrogen atom or an alkyl group having 1 to 4 carbon atoms; $R^4$ represents a hydrogen atom, an alkyl group having 1 to 4 carbon atoms or an alkoxy group having 1 to 4 carbon atoms and $R^5$ represents a hydrogen atom, alkyl group or aryl group, or $R^4$ and $R^5$ join together to form a ring, which may be heterocyclic; and $R^6$ represents a hydrogen atom, an alkyl group having 1 to 4 carbon atoms, an alkoxy group having 1 to 4 carbon atoms or a hydroxyl group.

13 Claims, No Drawings

PHOTORESIST COMPOSITIONS

BACKGROUND OF THE INVENTION

1. Field of the Invention

The present invention relates to photoresist compositions suitable for lithography using high energy radiation such as a far ultraviolet ray from an eximer laser and the like, electron beam, X-ray or radiated light, and to resins useful as an ingredient of the same compositions.

2. Description of the Related Art

Recently, pattern formation on a quarter micron order has been required with increased high integration of integrated circuits. Eximer laser lithography particularly draws attention since it enables production of the 64 M DRAM and the 256 M DRAM. As a resist suitable for a eximer laser lithography process, a so-called chemical amplification type photoresist utilizing an acid catalyst and a chemical amplification effect is suggested. In a resist film made from a chemical amplification type photoresist, the solubility of irradiated portions in an alkaline developer changes by way of a reaction using an acid as a catalyst, which acid is generated from an acid generating agent in portions irradiated with a radiation. By this reaction, the chemical amplification type photoresist gives a positive type or negative type pattern.

In the production of semiconductor integrated circuits, photolithography is conducted on various substrates. Usually, a photoresist is required to have high transparency against the radiation used for irradiation. However, when lithography is conducted on a substrate having a significantly high reflection ratio against the radiated light, it may be necessary to decrease the transparency of a photoresist to a certain degree in order to avoid unnecessary exposure of the photoresist to the reflected light from the substrate. In this case, a pigment component having a lower molecular weight is usually added to the resist. However, when such a pigment component is added, the basic ability of the resist tends to decrease.

SUMMARY OF THE INVENTION

An object of the present invention is to provide a raw material for a photoresist composition which reduces transparency of the photoresist composition but does not give adverse affects to the various properties of the photoresist composition such as sensitivity, resolution, heat resistance, film retention ratio, applicability and profile and, as a result, to provide a photoresist composition that is particularly excellent in its pattern forming properties.

The present inventors have intensively studied for attaining such an object, and found that a specific resin can reduce the transparency of a positive type photoresist composition without producing an adverse affects on the properties of the positive type photoresist composition. The present invention has thus been completed.

The present invention provides a photoresist composition which comprises, as one component of the photoresist composition, a resin having a structural unit represented by the following formula (I):

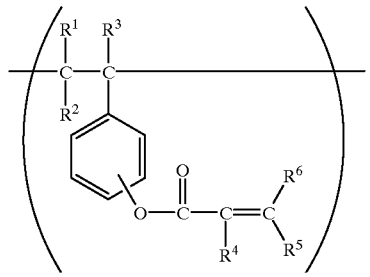

wherein $R^1$, $R^2$ ad $R^3$ each independently represents a hydrogen atom or an alkyl group having 1 to 4 carbon atoms; $R^4$ represents a hydrogen atom, an alkyl group having 1 to 4 carbon atoms or an alkoxy group having 1 to 4 carbon atoms and $R^5$ represents a hydrogen atom, alkyl group or aryl group, or $R^4$ and $R^5$ join together to form a ring, which may be heterocyclic; and $R^6$ represents a hydrogen atom, an alkyl group having 1 to 4 carbon atoms, an alkoxy group having 1 to 4 carbon atoms or a hydroxyl group.

By including the resin having a structural unit represented by the formula (I) into a photoresist, transparency of the photoresist can be controlled and a photoresist composition having a reduced transparency but having excellent properties is obtained.

This resin can be advantageously produced by allowing polyvinylphenols having a structure represented by the following formula (II):

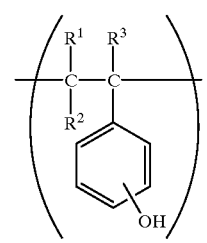

wherein $R^1$, $R^2$ and $R^3$ are as defined above to react with an acid halide represented by the following formula (III):

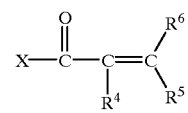

wherein $R^4$, $R^5$ and $R^6$ are as defined above, and X represents a halogen for esterifying a part of hydroxyl groups in the polyvinylphenols of formula (II).

DETAILED DESCRIPTION OF THE PREFERRED EMBODIMENTS

The photoresist referred to in the present invention is a radiation-sensitive coating material which is used for forming a film on a substrate and conducting selective irradiation (exposure) and development to form a pattern, and generally contains, as a binder, a resin component having a radiation-sensitive group, or contains, as a binder, a resin component and a radiation-sensitive component. Photoresists are classified according to positive type resists in which irradiated portions are dissolved in a developer and non-irradiated portions remain as a pattern and negative type resists in which non-irradiated portions are dissolved in a developer and irradiated portions are cured and remain as a pattern. In both cases, a novolak resin, an acrylic resin, a polyvinylphenol resin and the like have been used as a binder resin. A resin having a structural unit represented by the formula (I) can be applied to any of such resists containing a novolak resin, an acrylic resin, a polyvinylphenol resin or the like. In particular, a resin having a structural unit of formula (I) is effective for controlling the transparency of a so-called chemical amplification type photoresist, which contains an acid-generating agent and utilizes catalytic action of an acid generated from the acid-generating agent in irradiated portions. In such a chemical amplification type photoresist, a resin having a structural unit of formula (I) can on occasion also be used as a binder resin.

A chemical amplification type photoresist contains a resin component and an acid generating agent, and the acid generating agent generates an acid in irradiated portions, and catalytic action of the acid is utilized to from a pattern. In a chemical amplification type positive photoresist, acid generated in irradiated portions disperses by subsequent heat treatment (post exposure bake, sometimes abbreviated as PEB), which allows a protecting group of the resin to be released and re-produces an acid to make the irradiated portions soluble in an alkali.

Chemical amplification type positive photoresists are classified according to (i) resists which comprise an alkali-soluble resin component, an acid generating agent and a dissolution inhibitor which has a protecting group cleavable by the action of an acid and has itself an ability of inhibiting alkali-solubility of the alkali-soluble resin, but allows the resin to be alkali-soluble after cleavage of the protecting group by the action of an acid, and to (ii) resists which comprise an acid generating agent and a resin component which has a protecting group cleavable by the action of an acid, and which resin itself is insoluble or poorly soluble in an alkali and becomes alkali-soluble after cleavage of the above-described protecting group by the action of an acid.

A chemical amplification type negative photoresist comprises a resin component which is usually alkali-soluble, an acid generating agent and a cross-linking agent. In this chemical amplification type negative photoresist, an acid generated in irradiated portions disperses by PEB, acts on a cross-linking agent to cure a binder resin in the irradiated portions. In a chemical amplification type photoresist thus acting, a group corresponding to an acid generating agent, namely a group which is cleaved by the action of a light and generates an acid, may be sometimes appended to a side chain of the resin.

A resin having a structural unit of formula (I) is particularly effective for a chemical amplification type positive photoresist comprising a resin component, which has a protecting group cleavable by the action of an acid and that is itself insoluble or poorly soluble in an alkali and becomes alkali-soluble after cleavage of said protecting group by the action of an acid.

In such types of a chemical amplification photoresist compositions, a main resin is itself insoluble or poorly soluble in an alkali and becomes alkali-soluble by the action of an acid. For example, such a resin can be obtained from an alkali-soluble resin having a phenolic skeleton by protecting at least a part of the phenolic hydroxyl groups with a group having a dissolution inhibiting ability against an alkaline developer and being unstable against an acid.

Examples of such an alkali-soluble resin used for obtaining the main resin include novolak resins, polyvinylphenol resins, proisopropenylphenol resins, copolymers of vinylphenol with acrylic resin, methacrylic resin, acrylonitrile, methyl methacrylate, methyl acrylate, maleic acid, maleic anhydride, isopropenylphenol, styrene or α-methylstyrene, copolymer of isopropenylphenol with acrylic resin, methacrylic resin, acrylonitrile, methyl methacrylate, methyl acrylate, maleic acid, maleic anhydride, styrene or α-methylstyrene, and the like. In vinylphenol and isopropenylphenol, the positional relation of a hydroxyl group with a vinyl group or isopropenyl group is not particularly restricted, although p-vinylphenol and p-isopropenylphenol are generally preferable. These resins may be partially hydrogenated in order to improve their transparency. Further, an alkyl group and alkoxy group and the like may be introduced into a phenol nucleus of said alkali-soluble resin within the range where alkali-solubility is maintained. Of these alkali-soluble resins, polyvinylphenol resins, namely a homopolymer of vinylphenol or a copolymer of vinylphenol with other monomers are preferably used.

The protecting group to be substituted for a hydrogen atom in a phenolic hydroxyl group in the alkali-soluble resin, which has dissolution inhibiting ability against an alkaline developer and is unstable against an acid, can be selected from known various protecting groups. Examples thereof include tert-butoxycarbonyl and tert-butoxycarbonylmethyl, 1-alkoxyalkyl groups such as 1-ethoxyethyl, 1-methoxyethyl, 1-propoxyethyl, 1-isopropoxyethyl, 1-tert-butoxyethyl, 1-isobutoxyethyl, 1-butoxyethyl, 1-pentyloxyethyl, 1-cyclopentyloxyethyl, 1-hexyloxyethyl, 1-cyclohexyloxyethyl, 1-heptyloxyethyl, 1-cycloheptyloxyethyl, 1-ethoxypropyl, 1-methoxypropyl and 1-methoxy-1-methylethyl, 2-residues of cyclic saturated ethers such as tetrahydro-2-pyranyl, 6-methoxytetrahydro-2-pyranyl, 6-ethoxytetrahydro-2-pyranyl, tetrahydro-2-furyl, 5-methoxytetrahydro-2-furyl and 5-ethoxytetrahydro-2-furyl, and the like. Of these protecting groups, 1-alkoxyalkyl groups are particularly preferable. The ratio of hydroxyl groups substituted by a protecting group unstable against an acid to total phenolic hydroxyl groups in the alkali-soluble resin (protecting group introduction ratio) is preferably from 10 to 50%.

In a chemical amplification type positive photoresist comprising a resin component which has a protecting group cleavable by the action of an acid and itself is insoluble or poorly soluble in an alkali and becomes alkali-soluble after cleavage of said protecting group by the action of an acid, it is preferable that whole or at least a part of resin component thereof is a polyvinylphenol resin in which phenolic hydroxyl groups are partially protected with a group which has dissolution inhibiting ability against an alkaline developer and unstable against an acid. Particularly preferable are polyvinylphenol resins in which phenolic hydroxyl groups are partially protected by a 1-alkoxyalkyl group or 2-residue of a cyclic saturated ether, particularly, a 1-ethoxyethyl group.

A photoresist composition of the present invention comprises a resin having a structural unit of formula (I) as at least part of the resin components. In the formula (I), each of $R^1$, $R^2$ and $R^3$ represents a hydrogen atom or an alkyl group having 1 to 4 carbon atoms, and preferably a hydrogen atom or methyl group. It is particularly preferable that $R^1$ ad $R^2$ represent a hydrogen atom and $R^3$ represents a hydrogen atom or methyl group considering the availability of the raw materials.

$R^4$ in the formula (I) represents a hydrogen atom, an alkyl group having 1 to 4 carbon atoms or an alkoxy group having 1 to 4 carbon atoms. $R^5$ in the formula (I) represents a hydrogen atom, alkyl group or aryl group. Alternatively, $R^4$ and $R^5$ join together to form a ring. The ring may be heterocyclic. $R^6$ in the formula (I) represents a hydrogen atom, an alkyl group having 1 to 4 carbon atoms, an alkoxy group having 1 to 4 carbon atoms or a hydroxyl group. When $R^5$ is an alkyl group, the number of carbon atoms thereof may be from 1–20 or more, but, in general, it is from 1 to 4. Examples of aryl represented by $R^5$ includes phenyl and naphthyl which may be optionally substituted with an alkyl having about 1 to 4 carbon atoms, an alkoxy having about 1 to 4 carbon atoms, hydroxyl group and the like.

When $R^4$ and $R^5$ join together to form a ring (i.e. that contains the 2 carbon atoms that originally bond to each of $R^4$ and $R^5$), the resulting ring is typically a 5-membered ring or 6-membered ring but may be a larger ring. When the ring is a hetero ring, the hetero atom included in the ring may be an oxygen atom, a sulfur atom and the like. Examples of such ring include a benzene ring, furan ring, thiophene ring and the like. These rings may be optionally substituted with a substituent, and examples of such a substituent include an alkyl group having 1 to 4 carbon atoms, an alkoxy group having 1 to 4 carbon atoms, hydroxyl group and the like.

Regarding $R^4$ and $R^5$, it is preferable that they join together to form a ring. It is also preferable that $R^4$ represents a hydrogen atom, alkyl group or alkoxy group and $R^5$ represents an aryl group. It is particularly preferable that $R^4$ and $R^5$ join together to form a benzene ring or a furan ring, and that $R^5$ has a structural unit, such as an aryl, having a double bond conjugated to the carbon-carbon double bond in the formula (I).

Examples of the particularly preferable case include: a resin having a structural unit represented by the following formula (Ia):

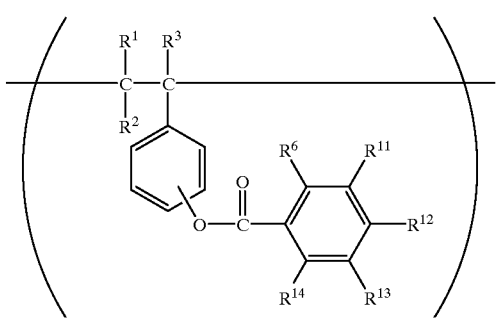

(Ia)

wherein $R^1$, $R^2$, $R^3$ and $R^6$ are as defined above, and $R^{11}$, $R^{12}$, $R^{13}$ and $R^{14}$ each independently represent a hydrogen atom, an alkyl group having 1 to 4 carbon atoms, an alkoxy group having 1 to 4 carbon atoms or a hydroxyl group;

resin having a structural unit represented by the following formula (Ib):

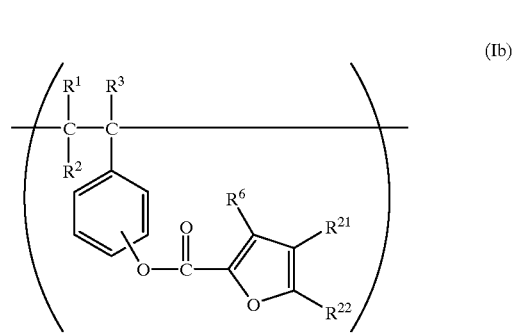

(Ib)

wherein $R^1$, $R^2$, $R^3$ and $R^6$ are as defined above, and $R^{21}$ and $R^{22}$ each independently represents a hydrogen atom, an alkyl group having 1 to 4 carbon atoms, an alkoxy group having 1 to 4 carbon atoms or a hydroxyl group; and a resin having a structural unit represented by the following formula (Ic):

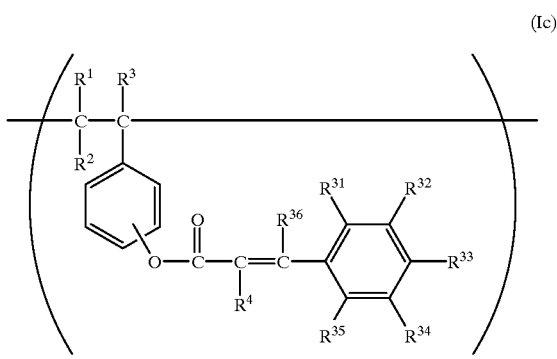

(Ic)

wherein $R^1$, $R^2$, $R^3$ and $R^4$ are as defined above, and $R^{31}$, $R^{32}$, $R^{33}$, $R^{34}$ and $R^{35}$ each independently represents a hydrogen atom, an alkyl group having 1 to 4 carbon atoms, an alkoxy group having 1 to 4 carbon atoms or hydroxyl group, and $R^{36}$ represents a hydrogen atom or an alkyl group having 1 to 4 carbon atoms.

A resin having a structural unit represented by the formula (I) can be obtained, for example, by polymerizing or copolymerizing a styrene compound represented by the following formula (IV):

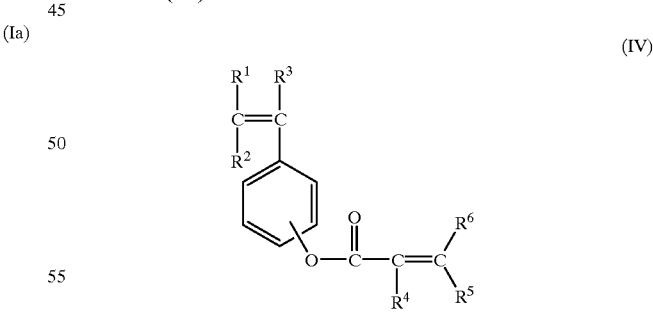

(IV)

wherein $R^1$, $R^2$, $R^3$, $R^4$, $R^5$ and $R^6$ are as defined above. In the case of homopolymerization, the product is substantially only composed of repetitions of structural units represented by the formula (I). When used as one component of a photoresist composition, a copolymer containing the structural units represented by the formula (I) in an amount of from about 1 to 30 mol % of the total structural units of the copolymer is preferable.

As other structural units to be contained in the copolymer, those having a group unstable against an acid as described above can be used. Examples thereof include: units represented by the following formula (V):

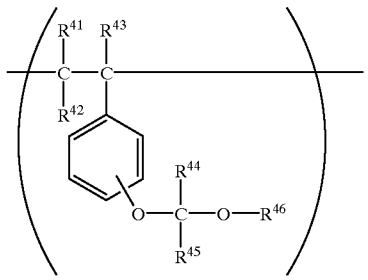

(V)

wherein $R^{41}$, $R^{42}$, $R^{43}$ and $R^{44}$ each independently represents a hydrogen atom or an alkyl group having 1 to 4 carbon atoms, $R^{45}$ represents an alkyl group having 1 to 4 carbon atoms, $R^{46}$ represents an alkyl group or a cycloalkyl group, or $R^{45}$ and $R^{46}$ join together to form an alkylene chain, which thereby forms a ring with the —C($R^{44}$)—O— moiety that connects $R^{45}$ and $R^{46}$, and wherein the alkylene chain forming said ring may be optionally substitued with an alkoxy group;
units derived from vinylphenols represented by the following formula (VI):

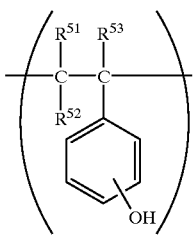

(IV)

wherein $R^{51}$, $R^{52}$ and $R^{53}$ each independently represents a hydrogen atom or an alkyl group having 1 to 4 carbon atoms or α- or β-substituted compounds thereof; and the like.

A photoresist composition comprising a resin containing a unit having a group unstable against an acid, such as a unit represented by the formula (V), together with an acid-generating agent comes to act on a positive type resist. Such a unit is preferably contained in the resin in an amount of about 10 to 50%. When $R^{46}$ in the formula (V) is an alkyl group, the number of carbon atoms thereof may be from 1–20 or more, however, generally, it is 1 to about 4. When $R^{46}$ in the formula (V) is a cycloalkyl group, examples thereof include cyclopentyl, cyclohexyl, cycloheptyl and the like. When $R^{45}$ and $R^{46}$ in the formula (V) join together to form an alkylene chain, examples thereof include trimethylene and teetramethylene, respectively forming a tetrahydrofuran ring or a tetrahydropyran ring together with the carbon atom to which $R^{45}$ is bonded and the oxygen atom to which $R^{46}$ is bonded, and branched alkylene chains having about 4 to 10 carbon atoms. The alkylene chain formed by the joining together of $R^{45}$ and $R^{46}$ may be optionally substituted by an alkoxy group having 1 to 4 carbon atoms such as methoxy, ethoxy and the like.

Resins having a structural unit of formula (V) and/or a structural unit of formula (VI) together with a structural unit of formula (I) can be obtained by copolymerizing a styrene compound of formula (IV) and a styrene compound represented by the following formula (VII) and/or a styrene compound represented by the following formula (VIII):

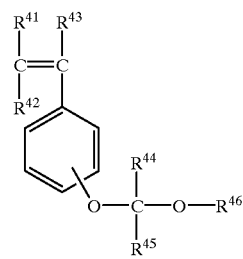

(VII)

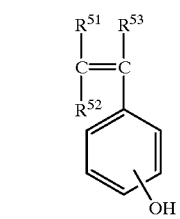

(VIII)

wherein $R^{41}$, $R^{42}$, $R^{43}$, $R^{44}$, $R^{45}$, $R^{46}$, $R^{51}$, $R^{52}$ and $R^{53}$ are as defined above.

Alternatively, the resins can also be produced by reacting polyvinylphenols having a structure of formula (II) with an acid halide of formula (III) and, if necessary, further reacting the product with an unsaturated ether compound represented by the following formula (IX):

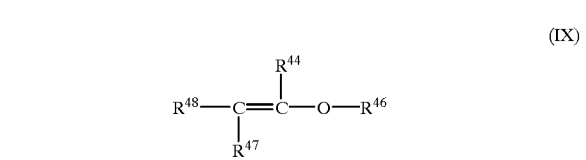

(IX)

wherein $R^{44}$ and $R^{46}$ are as defined above, $R^{47}$ and $R^{48}$ each independently represents a hydrogen atom or an alkyl group having 1 to 3 carbon atoms, provided that the total amount of carbon atoms in both groups is from 1 to 3, or, $R^{46}$ and $R^{47}$ join together to form an alkylene chain which may be optionally substituted with an alkoxy group.
This method is advantageous in general By reacting the resins produced by reacting polyvinylphenols having a structure of formula (II) with an acid halide of formula (III) with an unsaturated ether compound of formula (IX), a resin having a structural unit represented by the following formula (Va):

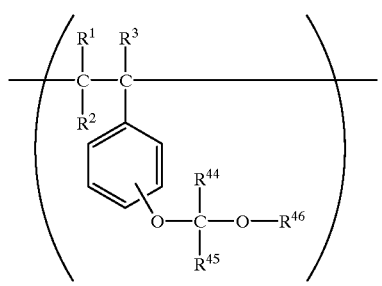

(Va)

wherein $R^1$, $R^2$, $R^3$, $R^{44}$, $R^{45}$ and $R^{46}$ are as defined above, in addition to structural units represented by the formulae (I) and (II) is obtained.

In the formula (II), the position of a hydroxyl group on the benzene ring is not particularly restricted, although it is generally in the p-position. Typical examples of a polyvinylphenol represented by the formula (II) include polyvinylphenol and polyisopropenylphenol. Of acid halides represented by the formula (III), specific examples thereof for obtaining a unit of formula (Ia) include benzoyl chloride, 2-, 3- or 4-methylbenzoyl chloride, 2-, 3- or 4-ethylbenzoyl chloride, 2-, 3- or 4-butylbenzoyl chloride, 2-, 3- or 4-anisoyl chloride, 2-, 3- or 4-tert-butoxybenzoyl chloride, 2,3-, 2,4-, 2,5-, 2,6-, 3,4- or 3,5-dimethylbenzoyl chloride, 2,3-, 2,4-, 2,5-, 2,6-, 3,4- or 3, 5-diethylbenzoyl chloride, 2,3-, 2,4-, 2,5-, 2,6-, 3,4- or 3,5-di-tert-butoxybenzoyl chloride, 2,3-, 2,4-, 2,5-, 2,6-, 3,4- or 3,5-dimethoxybenzoyl chloride, 2,3,4-, 2,3,5-, 2,3,6-, 2,4,5-, 2,4,6- or 3,4,6-trimethylbenzoyl chloride and the like. Specific examples of the acid halides for obtaining a unit of the formula (Ib) include 2-furoyl chloride, 3-methyl-2-furoyl chloride, 3-ethyl-2-furoyl chloride, 3-methoxy-2-furoyl chloride, 3-ethoxy-2-furoyl chloride, 4-methyl-2-furoyl chloride, 4-ethyl-2-furoyl chloride, 4-methoxy-2-furoyl chloride, 4-ethoxy-2-furoyl chloride, 5-methyl-2-furoyl chloride, 5-ethyl-2-furoyl chloride, 5-methoxy-2-furoyl chloride, 5-ethoxy-2-furoyl chloride and the like. Specific examples of the acid halides for obtaining a unit of the formula (Ic) include cinnamic chloride, α-methylcinnamoyl chloride, methyl-trans-cinnamoyl chloride, methyl-cis-cinnamoyl chloride, α-methoxycinnamoyl chloride, methoxy-trans-cinnamoyl chloride, methoxy-cis-cinnamoyl chloride, 2-methylcinnamoyl chloride, 2-methoxycinnamoyl chloride, 3-cinnamoyl chloride, 3-methoxycinnamoyl chloride, 4-methylcinnamoyl chloride, 4-methoxycinnamoyl chloride and the like.

3-Furoyl harides such as 3-furoyl chloride, 2-methyl-3-furoyl chloride, 2-ethyl-3-furoyl chloride, 2-methoxy-3-furoyl chloride, 2-ethoxy-3-furoyl chloride, 4-methyl-3-furoyl chloride, 4-ethyl-3-furoyl chloride, 4-methoxy-3-furoyl chloride, 4-ethoxy-3-furoyl chloride, 5-methyl-3-furoyl chloride, 5-ethyl-3-furoyl chloride, 5-methoxy-3-furoyl chloride and 5-ethoxy-3-furoyl chloride, thiophenecarbonyl halides such as 2-thiophenecarboxyl chloride and 3-thiophenecarbonyl chloride, and the like can also be used as an acid halide of the formula (III).

An acid halide of the formula (III) is used in an amount necessary for converting the unit of formula (II) constituting polyvinylphenols into a unit of the formula (I). For example, when 1 to 30 mol % of hydroxyl groups in polyvinylphenols is to be converted to a unit of formula (I), an acid halide is used in an amount of 0.01 to 0.3 equivalent, or slightly more, based on hydroxyl groups in polyvinylphenols.

Specific examples of unsaturated ether compounds represented by the formula (IX) include ethylvinyl ether, methylvinyl ether, n-propylvinyl ether, isopropylvinyl ether, n-butylvinyl ether, isobutylvinyl ether, tert-butylvinyl ether, sec-butylvinyl ether, n-pentylvinyl ether, cyclopentylvinyl ether, n-hexylvinyl ether, cyclohexylvinyl ether, ethyl 1-propenyl ether, methyl 1-propenyl ether, methylisopropenyl ether, ethyl 2-methyl-1-propenyl ether, 2,3-dihydrofuran, 3,4-dihydro-2H-pyran, 3,4-dihydro-2-methylfuran, 3,4-dihydro-2-methoxy-2H-pyran, 3,4-dihydro-2-ethoxy-2H-pyran and the like.

When an unsaturated ether compound represented by the formula (IX) is reacted, it is used in an amount necessary for converting the unit of formula (II) constituting polyvinylphenols into a unit of the formula (Va). For example, when 10 to 50 mol % of hydroxyl groups in polyvinylphenols are to be converted to a unit of formula (Va), an ether compound is used in an amount of 0.1 to 0.5 equivalent, or slightly more, based on the hydroxyl groups in polyvinylphenols.

Reaction of polyvinylphenols with an acid halide can be conducted by dissolving polyvinylphenols in a suitable solvent and adding thereto an acid halide of formula (III) in the presence of a basic catalyst.

Examples of solvents used in this reaction include glycol mono- or di-ether esters such as ethylcellosolve acetate, methylcellosolve acetate, propylene glycol monomethyl ether acetate and propylene glycol monoethyl ether acetate, diethers such as ethylcellosolve, methylcellosolve, propylene glycol monomethyl ether, propylene glycol monoethyl ether and diethylene glycol dimethyl ether, ethers such as diethyl ether, tetrahydrofuran, 1,4-dioxane, 1,3-dioxolane and diisopropyl ether, esters such as methyl acetate, ethyl acetate, butyl acetate, isobutyl acetate, ethyl lactate, ethyl pyruvate, methyl propionate and ethyl propionate, ketones such as acetone, methyl ethyl ketone, 2-heptanone, cyclohexanone and methyl isobutyl ketone, aromatic hydrocarbons such as xylene and toluene, and the like. A solvent is used in an amount of about from 1 to 100 times by weight based on the amount of polyvinylphenols, raw material resin.

Examples of the basic catalyst include primary amines such as hexylamine, heptylamine, octylamine, nonylamine, decylamine, aniline, 2-, 3- or 4-methylaniline, 4-nitroaniline, 1-naphthylamine and 2-naphthylamine; secondary amines such as dibutylamine, dipentylamine, dihexylamine, diheptylamine, dioctylamine, dinonylamine, didecylamine, N-methylaniline, piperidine and diphenylamine: tertiary amines such as triethylamine, trimethylamine, tripropylamine, tributylamine, tripentylamine, trihexylamine, triheptylamine, trioctylamine, trinonylamine, tridecylamine, methyldibutylamine, methyldipentylamine, methyldihexylamine, methyldicyclohexylamine, methyldiheptylamine, methyldioctylamine, methyldinonylamine, methyldidecylamine, ethyldibutylamine, ethyldipentylamine, ethyldihexylamine, ethyldiheptylamine, ethyldioctylamine, ethyldinonylamine, ethyldidecylamine, tris[2-(2-methoxyethoxy)ethyl]amine, triisopropanolamine and N,N-dimethylaniline; diamines such as ethylenediamine, tetramethylenediamine and hexamethylenediamine; unsaturated cyclic amines such as imidazole, pyridine, 4-methylpyridine, 4-methylimidazole and bipyridine; and the like. A basic catalyst is used in an amount of from about 1 to 100 times by weight based on the amount of acid halide.

This reaction proceeds under normal, reduced or increased pressure. This reaction is usually conducted for 1 to 96 hours at a temperature not more than the boiling point of the solvent and the acid halide. After completion of the reaction, a resin having a structural unit of the formula (I) is obtained in the form of a solution or can be isolated as solid by performing usual post-treatment operations such as extraction, crystallization and the like.

The reaction of a unsaturated ether compound of formula (IX) with a resin into which a structural unit of formula (I) has been introduced can be conducted in a suitable solvent in the presence of an acid catalyst. Examples of the suitable solvent include the same solvents as those exemplified for the above-described reaction with an acid halide of formula (III). The solvent is used in an amount of from about 1 to 100 times by weight based on the amount of the raw material resin.

Examples of acid catalysts used in this reaction include inorganic acids such as hydrochloric acid and sulfuric acid, amine salts of inorganic acids such as triethylamine hydrochloride and pyridine hydrochloride, organic carboxylic acids such as oxalic acid, organic sulfonic acids such as p-toluene sulfonic acid, camphorsulfonic acid, n-propanesulfonic acid and n-butanesulfonic acid, amine salts of organic sulfonic acids such as pyridine salt of p-toluenesulfonic acid and triethylamine salt of p-toluenesulfonic acid; and the like. The acid catalyst is used in an amount of about 0.001 to 100 mol % based on the amount of a unsaturated ether compound of formula (IX).

This reaction proceeds under normal pressure, a reduced pressure or an increased pressure. This reaction is usually conducted for 1 to 96 hours at a temperature of not more than the boiling point of the unsaturated ether compound. After completion of the reaction, usual post-treatment operations such as extraction, crystallization and the like are performed, and a resin in which a part of the units of formula (II) have been converted to units of formula (I) and other parts have been converted to units of formula (Va) can be obtained in the form of a solution or can be isolated as a solid.

Thus obtained resins can be used singly or in combination with other resins, as a resin component of a photoresist. Examples of other resins to be used together therewith include resins which are insoluble or poorly soluble in an alkali but become alkali-soluble with the action of an acid.

A chemical amplification type photoresist usually contains an acid generating agent. The acid generating agent can be selected from various compounds generating an acid by irradiation onto the substance itself or a resist composition containing the substance. This can be used as a single compound or in admixture of two or more species. Examples thereof include onium salts, organic halogen compounds, compounds having a diazomethanedisulfonyl skeleton, disulfone compounds, o-quinonediazide compounds, sulfonic acid compounds, and the like. In the present invention, compounds having a diazomethanedisulfonyl skeleton, disulfone compounds, sulfonic acid compounds and the like are preferably used as an acid generating agent. Examples of the sulfonic acid compound used for an acid generating agent include esters of alkylsulfonic acids, esters of haloalkylsulfonic acids, esters of arylsulfonic acids, esters of camphorsulfonic acid, and the like. As alcohol components constituting these esters, pyrogallol, 2- or 4-nitrobenzyl alcohol, 2,6-dinitrobenzyl alcohol, N-hydroxyimide compound, oxime compounds and the like are listed.

Examples of the compounds having a diazomethanedisulfonyl skeleton includes bis(cyclohexylsulfonyl)diazomethane, bis(phenylenesulfonyl)diazomethane, bis(p-tolylsulfonyl)diazomethane, bis(2,4-xylylsulfonyl)diazomethane and the like. Examples of the disulfone compounds include diphenyldisulfone, di-p-tolyldisulfone, phenyl p-tolyldisuldone, phenyl p-methoxyphenyl disulfone and the like. Examples of the sulfonic acid compounds include N-(phenylsulfonyloxy)succinimide, N-(methylsulfonyloxy)succinimide, N-(trifluoromethylsulfonyloxy)succinimide, N-(butylsulfonyloxy)succinimide, N-(10-camphorsulfonyloxy)succinimide, N-(trifluoromethylsulfonyloxy)phthalimide, N-(trifluoromethylsulfonyloxy)naphtalimide, 2-nitrobenzyl p-toluenesulfonate, 4-nitrobenzyl p-toluene sulfonate, 2,6-dinitrobenzyl p-toluenesulfonate, 1,2,3-benzenetoluyl trismethanesulfonate, 1-benzoyl-1-phenylmethyl p-toluenesulfonate (commonly referred to as benzoin tosylate) 2-benzoyl-2-hydroxy-2-phenylethyl p-toluenesulfonate (commonly referred to as α-methylolbenzoin tosylate), α-(p-tolylsulfonyloxyimino)-4-methoxyphenylacetonitrile, and the like.

In a chemical amplification type positive photoresist of the present invention, an organic base compound is preferably compounded as a quencher for suppressing degradation in abilities due to deactivation of an acid occurring when left intact after exposure. Specific examples of an organic base compound herein used include primary amines such as hexylamine, heptylamine, octylamine, nonylamine, decylamine, aniline, 2-, 3- or 4-methylaniline, 4-nitroaniline, 1-naphtylamine and 2-naphthylamine; secondary amines such as dibutylamine, dipentylamine, dihexylamine, diheptylamine, dioctylamine, dinonylamine, didecylamine, N-methylaniline, piperidine and diphenylamine: tertiary amines such as triethylamine, trimethylamine, tripropylamine, tributylamine, tripentylamine, trihexylamine, triheptylamine, trioctylamine, trinonylamine, tridecylamine, methyldibutylamine, methyldipentylamine, methyldihexylamine, methyldicyclohexylamine, methyldiheptylamine, methyldioctylamine, methyldinonylamine, methyldidecylamine, ethyldibutylamine, ethyldipentylamine, ethyldihexylamine, ethyldiheptylamine, ethyldioctylamine, ethyldinonylamine, ethyldidecylamine, tris[2-(2-methoxyethoxy)ethyl]amine, triisopropanolamine and N,N-dimethylaniline; diamines such as ethylenediamine, tetramethylenediamine and hexamethylenediamine; unsaturated cyclic amines such as imidazole, pyridine, 4-methylpyridine, 4-methylimidazole and bipyridine; and the like. These organic basic compounds can be used singly or in admixture of two or more species. Of these organic base compounds exemplified above, preferable are compounds which do not vaporize at prebaking temperature so that they remain in a resist film and reveal effects even after prebaking of a resist film formed on a substrate. Among the preferable compounds, those having a boiling point of 150° C. or more are more preferable, and, among them, tertiary amines are particularly preferable.

The amount of the resin component is from about 50 to 98% by weight, preferably from about 75 to 98% by weight based on the total amount of solid components in the photoresist of the present invention. The amount of a resin having a structural unit of the formula (I) is about 3% by weight or more, preferably 7% by weight or more, based on the total weight of resin components comprised in the photoresist of the present invention. In order to reduce the degree of permeation, the amount of this resin is about 30% by weight or more, preferably 50% by weight or more, based on the total weight of resin components It is usually preferable that the amount of the acid generating agent is from about 0.05 to 20% by weight based on the total amount of solid components in the photoresist of the present invention. It is usually preferable that the amount of the organic base compound is from about 0.001 to 10% by weight based on the total amount of solid components in the photoresist of the present invention.

A photoresist composition of the present invention can further contain various additives usually used in this art such as a dissolution inhibitor, sensitizer, dye, adhesion improving agent and the like, if necessary. The total amount thereof is up to about 20% by weight based on the total amount of solid components in the composition.

The above-described components are mixed in a solvent to prepare a resist solution so that the total concentration of solid components is usually from about 10 to 50% by weight, and this solution is applied on a substrate such as a silicon wafer and the like. Any solvents which can dissolve the components, such as those usually used in this field, can be used. Examples thereof include glycol ether esters such as ethyl cellosolve acetate, methylcellosolve acetate, propylene glycol monomethyl ether acetate and propylene glycol monoethyl ether acetate, glycol mono or diethers such as ethyl cellosolve, methylcellosolve, propylene glycol monomethyl ether, propylene glycol monoethyl ether and diethylene glycol dimethyl ether, esters such as ethyl lactate, butyl acetate and ethyl pyruvate, ketones such as 2-heptanone, cyclohexanone, methyl isobutyl ketone, aromatic hydrocarbons such as xylene, and the like. These solvents can be used singly or in combination of two or more species.

A resist film applied on a substrate is usually subjected to processes such as prebaking, patterning exposure, PEB, and developing with an alkali developer, to form a resist pattern.

The following examples further illustrate the present invention but do not limit the scope thereof. In the examples, % and parts expressing contents and amounts used are all by weight unless otherwise stated.

SYNTHESIS EXAMPLE 1
(1a) Partial benzoylation of polyvinylphenol 80 g of poly(p-vinylphenol) (0.067 mol as p-vinylphenol unit) and 800 g of propylene glycol monomethyl ether acetate were charged into a flask, and stirred to dissolve the resin. Then, distillation was conducted at 60° C. under a reduced pressure of 20 Torr to remove 260 g of solvent, propylene glycol monomethyl ether acetate. To this resin solution thus obtained was added 10.1 g (0.10 mol, 0.15 equivalent based on hydroxyl groups in poly(p-vinylphenol)) of triethylamine. The resulting solution was heated to 50° C., then, 9.4 g (0.067 mol, 0.1 equivalent based on hydroxyl groups in poly (p-vinylphenol)) of benzoyl chloride was added dropwise. The solution was stirred for 3 hours at 50° C., then, 48 g of propylene glycol monomethyl ether acetate, 533 g of methyl isobutyl ketone and 406 g of a 0.5% aqueous oxalic acid solution were added to the solution which was further stirred. Thereafter, a separation of layers of the solution was conducted. The operation in which 406 g of a 0.5% aqueous oxalic acid solution is added to the organic layer thus obtained and the separation of layers is conducted was repeated twice, and the resulting solution was washed. The resulting organic layer was further washed with 406 of ion-exchanged water tree times, followed by conducting a separation of layers. The solvent was distilled off from the organic layer for concentration to obtain 263 g a resin solution.

The concentration of solid components of the resin solution, measured by an evaporation method, was 34.9%. The ratio of the hydroxyl groups which had been benzoylated to the total hydroxyl groups in poly(p-vinylphenol) (protecting ratio) was measured by nuclear magnetic resonance (NMR) and it was 9.6%.

(1b) Partial 1-ethoxyethylation of resin obtained above 125 g of the resin solution (0.33 mol as original p-vinylphenol unit) obtained in (1a), 0.045 g of p-toluenesulfonic acid monohydrate and 573 g of propylene glycol monomethyl ether acetate were charged into a flask, and stirred and concentrated at 65° C. under a reduced pressure of 20 Torr. 196 g of resin solution obtained by the concentration was cooled to 20° C., then, 8.9 g (0.12 mol, 0.36 equivalent based on hydroxyl groups in poly(p-vinylphenol)) of ethylvinyl ether was added dropwise over 10 minutes from a dropping funnel. The resulting solution was stirred at 25 ° C. for 3 hours, then, 131 g of methyl isobutyl ketone and 84 g of ion-exchange water were added, and a separation of layers was conducted. The resulting organic layer was washed with 84 g of ion-exchanged water three times and an organic layer was obtained by a separation of layers. The solvent was distilled off from this organic layer for concentration. Then, a solvent substitution was carried out by adding 235 g of propylene glycol monomethyl ether acetate and distilling off the solvent to obtain 163 g resin solution of propylene glycol monomethyl ether acetate.

The concentration of solid components of the resin solution, measured by an evaporation method, was 29.1%. The ratio of the hydroxyl groups which had been 1-ethoxyethylated to the total hydroxyl groups in poly(p-vinylphenol) was measured by nuclear magnetic resonance (NMR) and it was 32.0%. The ratio of the hydroxyl groups which had been benzoylated to the total hydroxyl groups in poly(p-vinylphenol) was 9.6%. This resin contains structural units of the following formula, and is called Resin R1.

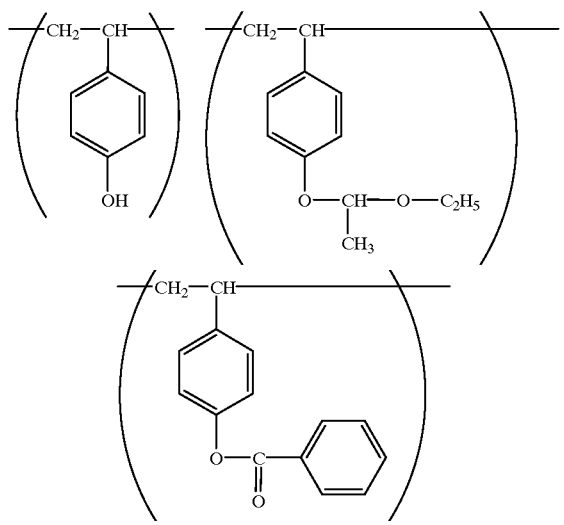

SYNTHESIS EXAMPLE 2
(2a) Partial 2-furoylation of polyvinylphenol 110 g of poly(p-vinylphenol) (0.92 mol asp-vinylphenol unit) and 1320 g of propylene glycol monomethyl ether acetate were charged into a flask, and stirred to dissolve the resin. Then, distillation was conducted at 60° C. under a reduced pressure of 20 Torr to remove 560 g of solvent, propylene glycol monomethyl ether acetate. To this resin solution thus obtained was added 9.3 g (0.092 mol, 0.1 equivalent based on hydroxyl groups in poly(p-vinylphenol)) of triethylamine. The resulting solution was heated to 50° C., then, 6.0 g (0.046 mol, 0.05 equivalent based on hydroxyl groups in poly(p-vinylphenol)) of 2-furoyl chloride was added dropwise. The solution was stirred for 3 hours at 50° C., then, 228 g of propylene glycol monomethyl ether acetate, 880 g of methyl isobutyl ketone and 665 g of a 0.5% aqueous oxalic acid solution were added to the solution which was further stirred. Thereafter, a separation of layers of the solution was conducted. The operation in which 665 g of a 0.5% aqueous oxalic acid solution is added to the organic layer thus obtained and the separation of layers is conducted was repeated twice, and the resulting solution was washed. The resulting organic layer was further washed with 665 g of ion-exchanged water three times, followed by conducting a separation of layers. The solvent was distilled off from the organic layer for concentration to obtain 437 g a resin solution.

The concentration of solid components of the resin solution, measured by an evaporation method, was 29.1%. The ratio of the hydroxyl groups which had been 2-furoylated to the total hydroxyl groups in poly(p-vinylphenol) (protecting ratio) was measured by nuclear magnetic resonance (NMR) and it was 3.9%.

(2b) Partial 1-ethoxyethylation of resin obtained above 85.8 g of the resin solution (0.20 mol as original p-vinylphenol unit) obtained in (2a), 0.028 g of p-toluenesulfonic acid monohydrate and 389 g of propylene glycol monomethyl ether acetate were charged into a flask, and stirred and concentrated at 65° C. under a reduced pressure of 20 Torr. 257.3 g of resin solution obtained by the concentration was cooled to 20° C., then, 5.5 g (0.076 mol, 0.38 equivalent based on hydroxyl groups in poly(p-vinylphenol)) of ethylvinyl ether was added dropwise over 10 minutes from a dropping funnel. The resulting solution was stirred at 25° C. for 3 hours, then, 200 g of methyl isobutyl ketone, 72 g of propylene glycol monomethyl ether acetate and 166 g of ion-exchange water were added, and a separation of layers was conducted. The resulting organic layer was washed with 166 g of ion-exchanged water three times and an organic layer was obtained by a separation of layers. The solvent was distilled off from this organic layer for concentration. Then, a solvent substitution was carried out by adding 154 g of propylene glycol monomethyl ether acetate and distilling off the solvent to obtain 89 g resin solution of propylene glycol monomethyl ether acetate.

The concentration of solid components of the resin solution, measured by an evaporation method, was 29.1%. The ratio of the hydroxyl groups which had been 1-ethoxyethylated to the total hydroxyl groups in poly(p-vinylphenol) was measured by nuclear magnetic resonance (NMR) and it was 31%. The ratio of the hydroxyl groups which had been 2-furoylated to the total hydroxyl groups in poly(p-vinylphenol) was 3.9%. This resin contains structural units of the following formula, and is called Resin R2.

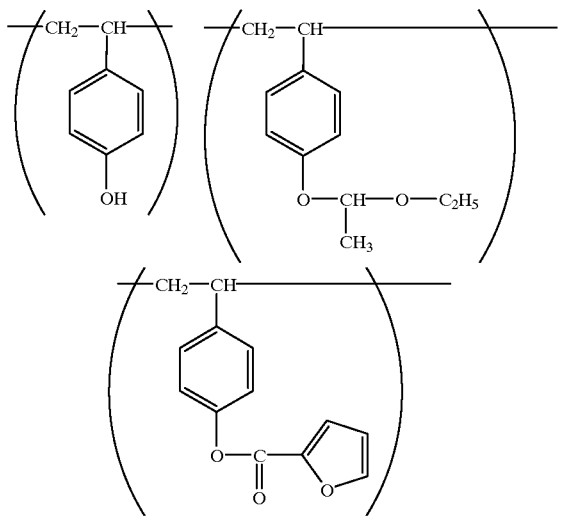

SYNTHESIS EXAMPLE 3

(3a) Partial 4-n-butylbenzoylation of polyvinylphenol 110 g of poly(p-vinylphenol) (0.92 mol as p-vinylphenol unit) and 1320 g of propylene glycol monomethyl ether acetate were charged into a flask, and stirred to dissolve the resin. Then, distillation was conducted at 60° C. under a reduced pressure of 20 Torr to remove 697 g of solvent, propylene glycol monomethyl ether acetate. To this resin solution thus obtained was added 9.3 g (0.092 mol, 0.1 equivalent based on hydroxyl groups in poly(p-vinylphenol)) of triethylamine. The resulting solution was heated to 50° C., then, 9.0 g (0.046 mol, 0.05 equivalent based on hydroxyl groups in poly(p-vinylphenol)) of 4-n-butylbenzoyl chloride was added dropwise. The solution was stirred for 3 hours at 50° C., then, 367 g of propylene glycol monomethyl ether acetate, 880 g of methyl isobutyl ketone and 666 g of a 0.5% aqueous oxalic acid solution were added to the solution which was further stirred. Thereafter, a separation of layers of the solution was conducted. The operation in which 666 g of a 0.5% aqueous oxalic acid solution is added to the organic layer thus obtained and the separation of layers is conducted was repeated twice, and the resulting solution was washed. The resulting organic layer was further washed with 666 g of ion-exchanged water three times, followed by conducting a separation of layers. The solvent was distilled off from the organic layer for concentration to obtain 423 g a resin solution.

The concentration of solid components of the resin solution, measured by an evaporation method, was 30.5%. The ratio of the hydroxyl groups which had been 4-n-butylbenzoylated to the total hydroxyl groups in poly(p-vinylphenol) (protecting ratio) was measured by nuclear magnetic resonance (NMR) and it was 5.4%.

(3b) Partial 1-ethoxyethylation of resin obtained above 82.0 g of the resin solution (0.19 mol as original p-vinylphenol unit) obtained in (3a), 0.026 g of p-toluenesulfonic acid monohydrate and 393 g of propylene glycol monomethyl ether acetate were charged into a flask, and stirred and concentrated at 65° C. under a reduced pressure of 20 Torr. 243 g of resin solution obtained by the concentration was cooled to 20° C., then, 5.2 g (0.072 mol, 0.38 equivalent based on hydroxyl groups in poly(p-vinylphenol)) of ethylvinyl ether was added dropwise over 10 minutes from a dropping funnel. The resulting solution was stirred at 25° C. for 3 hours, then, 200 g of methyl isobutyl ketone, 58 g of propylene glycol monomethyl ether acetate and 166 g of ion-exchange water were added, and a separation of layers was conducted. The resulting organic layer was washed with 166 g of ion-exchanged water three times and an organic layer was obtained by a separation of layers. The solvent was distilled off from this organic layer for concentration. Then, a solvent substitution was carried out by adding 182 g of propylene glycol monomethyl ether acetate and distilling off the solvent to obtain 88.2 g resin solution of propylene glycol monomethyl ether acetate.

The concentration of solid components of the resin solution, measured by an evaporation method, was 30.3%. The ratio of the hydroxyl groups which had been 1-ethoxyethylated to the total hydroxyl groups in poly(p-vinylphenol) was measured by nuclear magnetic resonance (NMR) and it was 30%. The ratio of the hydroxyl groups which had been 4-n-butylbenzoylated to the total hydroxyl groups in poly(p-vinylphenol) was 5.4%. This resin contains structural units of the following formula, and is called Resin R3.

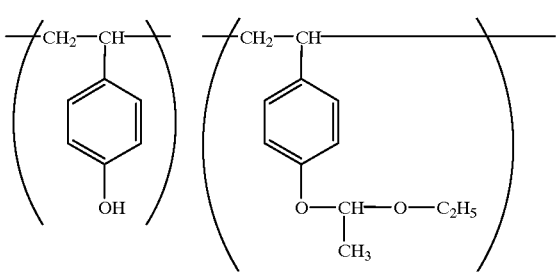

-continued

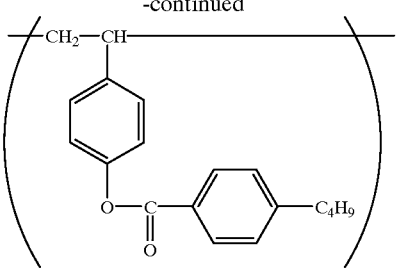

SYNTHESIS EXAMPLE 4
(4a) Partial 4-anisoylation of polyvinylphenol 110 g of poly(p-vinylphenol) (0.92 mol as p-vinylphenol unit) and 1320 g of propylene glycol monomethyl ether acetate were charged into a flask, and stirred to dissolve the resin. Then, distillation was conducted at 60° C. under a reduced pressure of 20 Torr to remove 606 g of solvent, propylene glycol monomethyl ether acetate. To this resin solution thus obtained was added 9.3 g (0.092 mol, 0.1 equivalent based on hydroxyl groups in poly(p-vinylphenol)) of triethylamine. The resulting solution was heated to 50° C., then, 7.8 g (0.046 mol, 0.05 equivalent based on hydroxyl groups in poly(p-vinylphenol)) of 4-anisoyl chloride was added dropwise. The solution was stirred for 3 hours at 50° C., then, 275 g of propylene glycol monomethyl ether acetate, 880 g of methyl isobutyl ketone and 666 g of a 0.5% aqueous oxalic acid solution were added to the solution which was further stirred. Thereafter, a separation of layers of the solution was conducted. The operation in which 666 g of a 0.5% aqueous oxalic acid solution is added to the organic layer thus obtained and the separation of layers is conducted was repeated twice, and the resulting solution was washed. The resulting organic layer was further washed with 666 of ion-exchanged water tree times, followed by conducting a separation of layers. The solvent was distilled off from the organic layer for concentration to obtain 440 g of a resin solution.

The concentration of solid components of the resin solution, measured by an evaporation method, was 28.9%. The ratio of the hydroxyl groups which had been 4-anisoylated to the total hydroxyl groups in poly(p-vinylphenol) (protecting ratio) was measured by nuclear magnetic resonance (NMR) and it was 5.0%.

(4b) Partial 1-ethoxyethylation of resin obtained above 86.5 g of the resin solution (0.20 mol as original p-vinylphenol unit) obtained in (4a), 0.026 g of p-toluenesulfonic acid monohydrate and 388 g of propylene glycol monomethyl ether acetate were charged into a flask, and stirred and concentrated at 65 ° C. under a reduced pressure of 20 Torr. 260 g of resin solution obtained by the concentration was cooled to 20° C., then, 5.4 g (0.074 mol, 0.38 equivalent based on hydroxyl groups in poly(p-vinylphenol)) of ethylvinyl ether was added dropwise over 10 minutes from a dropping funnel. The resulting solution was stirred at 25° C. for 3 hours, then, 200 g of methyl isobutyl ketone, 30 g of propylene glycol monomethyl ether acetate and 166 g of ion-exchange water were added, and a separation of layers was conducted. The resulting organic layer was washed with 166 g of ion-exchanged water three times and an organic layer was obtained by a separation of layers. The solvent was distilled off from this organic layer for concentration. Then, a solvent substitution was carried out by adding 139 g of propylene glycol monomethyl ether acetate and distilling off the solvent to obtain 91.9 g of a resin solution of propylene glycol monomethylether acetate.

The concentration of solid components of the resin solution, measured by an evaporation method, was 30.4%. The ratio of the hydroxyl groups which had been 1-ethoxyethylated to the total hydroxyl groups in poly(p-vinylphenol) was measured by nuclear magnetic resonance (NMR) and it was 30%. The ratio of the hydroxyl groups which had been 4-anisoylated to the total hydroxyl groups in poly(p-vinylphenol) was 5.0%. This resin contains structural units of the following formula, and is called Resin R4.

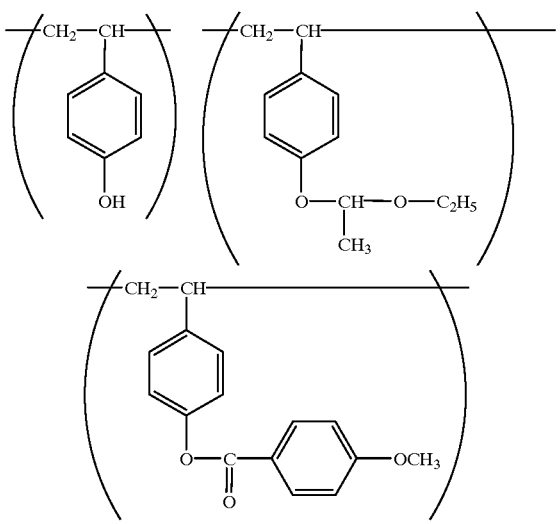

SYNTHESIS EXAMPLE 5
(5a) Partial 4-tert-butoxybenzoylation of polyvinylphenol 110 g of poly(p-vinylphenol) (0.92 mol as p-vinylphenol unit) and 1320 g of propylene glycol monomethyl ether acetate were charged into a flask, and stirred to dissolve the resin. Then, distillation was conducted at 60° C. under a reduced pressure of 20 Torr to remove 661 g of solvent. To this resin solution thus obtained was added 9.3 g (0.092 mol, 0.1 equivalent based on hydroxyl groups in poly (p-vinylphenol)) of triethylamine. The resulting solution was heated to 50° C., then, 9.0 g (0.046 mol, 0.05 equivalent based on hydroxyl groups in poly(p-vinylphenol)) of 4-tert-butoxybenzoyl chloride was added dropwise. The solution was stirred for 3 hours at 50° C., then, 331 g of propylene glycol monomethyl ether acetate, 880 g of methyl isobutyl ketone and 666 g of a 0.5% aqueous oxalic acid solution were added to the solution which was further stirred. Thereafter, a separation of layers of the solution was conducted. The operation in which 666 g of a 0.5% aqueous oxalic acid solution is added to the organic layer thus obtained and the separation of layers is conducted was repeated twice, and the resulting solution was washed. The resulting organic layer was further washed with 666 g of ion-exchanged water three times, followed by conducting a separation of layers. The solvent was distilled off from the organic layer for concentration to obtain 475 g a resin solution.

The concentration of solid components of the resin solution, measured by an evaporation method, was 27.2%. The ratio of the hydroxyl groups which had been 4-tert-butoxybenzoylated to the total hydroxyl groups in poly(p-vinylphenol) (protecting ratio) was measured by nuclear magnetic resonance (NMR) and it was 4.7%.

(5b) Partial 1-ethoxyethylation of resin obtained above 92.0 g of the resin solution (0.20 mol as original p-vinylphenol unit) obtained in (5a), 0.026 g of p-toluenesulfonic acid monohydrate and 382 g of propylene glycol monomethyl ether acetate were charged into a flask, and stirred and concentrated at 65° C. under a reduced pressure of 20 Torr. 186 g of resin solution obtained by the concentration was cooled to 20° C., then, 5.2 g (0.072 mol, 0.36 equivalent based on hydroxyl groups in poly(p-vinylphenol)) of ethylvinyl ether was added dropwise over 10 minutes from a dropping funnel. The resulting solution was stirred at 25° C. for 3 hours, then, 200 g of methyl isobutyl ketone, 104 g of propylene glycol monomethyl ether acetate and 166 g of ion-exchange water were added, and a separation of layers was conducted. The resulting organic layer was washed with 166 g of ion-exchanged water three times and an organic layer was obtained by a separation of layers. The solvent was distilled off from this organic layer for concentration. Then, a solvent substitution was carried out by adding 141 g of propylene glycol monomethyl ether acetate and distilling off the solvent to obtain 85.0 g resin solution of propylene glycol monomethyl ether acetate.

The concentration of solid components of the resin solution, measured by an evaporation method, was 32.6%. The ratio of the hydroxyl groups which had been 1-ethoxyethylated to the total hydroxyl groups in poly(p-vinylphenol) was measured by nuclear magnetic resonance (NMR) and it was 30%. The ratio of the hydroxyl groups which had been 4-tert-butoxybenzoylated to the total hydroxyl groups in poly(p-vinylphenol) was 4.7%. This resin contains structural units of the following formula, and is called Resin R5.

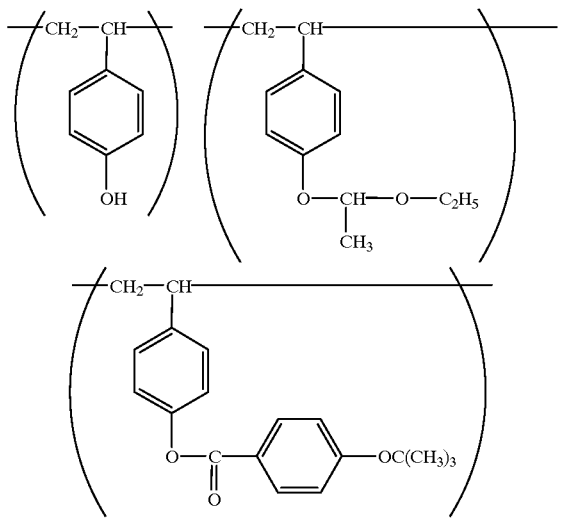

SYNTHESIS EXAMPLE 6

(6a) Partial 3-anisoylation of polyvinylphenol 10 g of poly(p-vinylphenol) (0.92 mol asp-vinylphenol unit) and 1320 g of propylene glycol monomethyl ether acetate were charged into a flask, and stirred to dissolve the resin. Then, distillation was conducted at 60° C. under a reduced pressure of 20 Torr to remove 681 g of solvent, propylene glycol monomethyl ether acetate. To this resin solution thus obtained was added 9.3 g (0.092 mol, 0.equivalent based on hydroxyl groups in poly(p-vinylphenol)) of triethylamine. The resulting solution was heated to 50° C., then, 7.8 g (0.046 mol, 0.05 equivalent based on hydroxyl groups in poly(p-vinylphenol)) of 3-anisoyl chloride was added dropwise. The solution was stirred for 3 hours at 50° C., then, 351 g of propylene glycol monomethyl ether acetate, 880 g of methyl isobutyl ketone and 666 g of a 0.5% aqueous oxalic acid solution were added to the solution which was further stirred. Thereafter, a separation of layers of the solution was conducted. The operation in which 666 g of a 0.5% aqueous oxalic acid solution is added to the organic layer thus obtained and the separation of layers is conducted was repeated twice, and the resulting solution was washed. The resulting organic layer was further washed with 666 g of ion-exchanged water three times, followed by conducting a separation of layers. The solvent was distilled off from the organic layer for concentration to obtain 466 g of a resin solution.

The concentration of solid components of the resin solution, measured by an evaporation method, was 27.9%. The ratio of the hydroxyl groups which had been 3-anisoylated to the total hydroxyl groups in poly(p-vinylphenol) (protecting ratio) was measured by nuclear magnetic resonance (NMR) and it was 5.5%.

(6b) Partial 1-ethoxyethylation of resin obtained above 90.7 g of the resin solution (0.20 mol as original p-vinylphenol unit) obtained in (6a), 0.026 g of p-toluenesulfonic acid monohydrate and 384 g of propylene glycol monomethyl ether acetate were charged into a flask, and stirred and concentrated at 65° C. under a reduced pressure of 20 Torr. 203 g of resin solution obtained by the concentration was cooled to 20° C., then, 5.1 g (0.071 mol, 0.36 equivalent based on hydroxyl groups in poly(p-vinylphenol)) of ethylvinyl ether was added dropwise over 10 minutes from a dropping funnel. The resulting solution was stirred at 25° C. for 3 hours, then, 200 g of methyl isobutyl ketone, 87 g of propylene glycol monomethyl ether acetate and 166 g of ion-exchange water were added, and a separation of layers was conducted. The resulting organic layer was washed with 166 g of ion-exchanged water three times and an organic layer was obtained by a separation of layers. The solvent was distilled off from this organic layer for concentration. Then, a solvent substitution was carried out by adding 168 g of propylene glycol monomethyl ether acetate and distilling off the solvent to obtain 102.5 g resin solution of propylene glycol monomethylether acetate.

The concentration of solid components of the resin solution, measured by an evaporation method, was 26.8%. The ratio of the hydroxyl groups which had been 1-ethoxyethylated to the total hydroxyl groups in poly(p-vinylphenol) was measured by nuclear magnetic resonance (NMR) and it was 30%. The ratio of the hydroxyl groups which had been 3-anisoylated to the total hydroxyl groups in poly(p-vinylphenol) was 5.5%. This resin contains structural units of the following formula, and is called Resin R6.

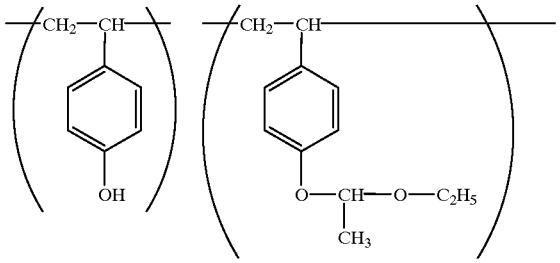

-continued

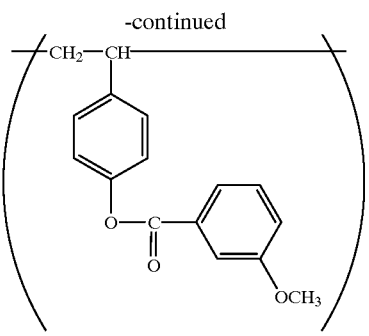

SYNTHESIS EXAMPLE 7
(7a) Partial cinnamoylation of polyvinylphenol 110 g of poly(p-vinylphenol) (0.92 mol as p-vinylphenol unit) and 1320 g of propylene glycol monomethyl ether acetate were charged into a flask, and stirred to dissolve the resin. Then, distillation was conducted at 60° C. under a reduced pressure of 20 Torr to remove 695 g of solvent, propylene glycol monomethyl ether acetate. To this resin solution thus obtained was added 9.3 g (0.092 mol, 0.1 equivalent based on hydroxyl groups in poly(p-vinylphenol)) of triethylamine. The resulting solution was heated to 50° C., then, 7.6 g (0.046 mol, 0.05 equivalent based on hydroxyl groups in poly(p-vinylphenol)) of cinnamoyl chloride was added dropwise. The solution was stirred for 3 hours at 50° C., then, 365 g of propylene glycol monomethyl ether acetate, 880 g of methyl isobutyl ketone and 666 g of a 0.5% aqueous oxalic acid solution were added to the solution which was further stirred. Thereafter, a separation of layers of the solution was conducted. The operation in which 666 g of a 0.5% aqueous oxalic acid solution is added to the organic layer thus obtained and the separation of layers is conducted was repeated twice, and the resulting solution was washed. The resulting organic layer was further washed with 666 g of ion-exchanged water three times, followed by conducting a separation of layers. The solvent was distilled off from the organic layer for concentration to obtain 461 g of a resin solution.

The concentration of solid components of the resin solution, measured by an evaporation method, was 28.0%. The ratio of the hydroxyl groups which had been cinnamoylated to the total hydroxyl groups in poly(p-vinylphenol) (protecting ratio) was measured by nuclear magnetic resonance (NMR) and it was 5.2%.

(7b) Partial 1-ethoxyethylation of resin obtained above 89.3 g of the resin solution (0.20 mol as original p-vinylphenol unit) obtained in (7a), 0.026 g of p-toluenesulfonic acid monohydrate and 388 g of propylene glycol monomethyl ether acetate were charged into a flask, and stirred and concentrated at 65° C. under a reduced pressure of 20 Torr. 145 g of resin solution obtained by the concentration was cooled to 20° C., then, 5.3 g (0.073 mol, 0.37 equivalent based on hydroxyl groups in poly(p-vinylphenol)) of ethylvinyl ether was added dropwise over 10 minutes from a dropping funnel. The resulting solution was stirred at 25° C. for 3 hours, then, 200 g of methyl isobutyl ketone, 145 g of propylene glycol monomethyl ether acetate and 166 g of ion-exchange water were added, and a separation of layers was conducted. The resulting organic layer was washed with 166 g of ion-exchanged water three times and an organic layer was obtained by a separation of layers. The solvent was distilled off from this organic layer for concentration. Then, a solvent substitution was carried out by adding 168 g of propylene glycol monomethyl ether acetate and distilling off the solvent to obtain 85.6 g of a resin solution of propylene glycol monomethylether acetate.

The concentration of solid components of the resin solution, measured by an evaporation method, was 32.3%. The ratio of the hydroxyl groups which had been 1-ethoxyethylated to the total hydroxyl groups in poly(p-vinylphenol) was measured by nuclear magnetic resonance (NMR) and it was 30%. The ratio of the hydroxyl groups which had been cinnamoylated to the total hydroxyl groups in poly(p-vinylphenol) was 5.2%. This resin contains structural units of the following formula, and is called Resin R7.

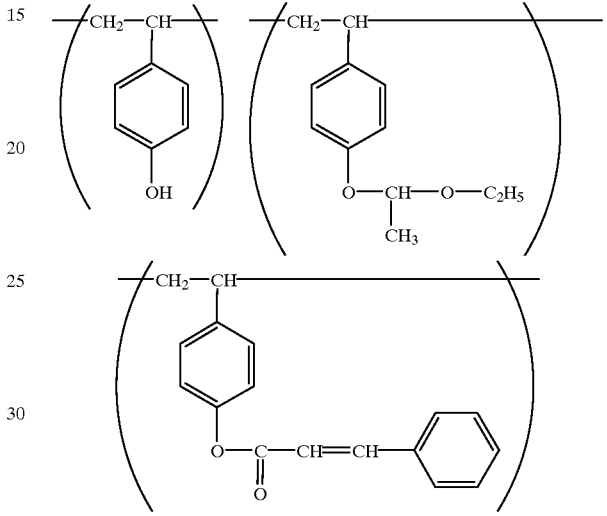

SYNTHESIS EXAMPLE 8
(Partial 1-ethoxyethylation of polyvinylphenol)

40.0 g of a polyvinyphenol (0.33 mol as p-vinylphenol unit), 0.057 g of p-toluenesulfonic acid monohydrate and 480 g of methyl isobutyl ketone were charged into a flask, and stirred and concentrated at 65° C. under a reduced pressure of 60 Torr. 258 g of resin solution obtained by the concentration was cooled to 20° C., then, 12.0 g (0.17 mol, 0.5 equivalent based on hydroxyl groups in poly(p-vinylphenol)) of ethylvinyl ether was added dropwise over 10 minutes from a dropping funnel. The resulting solution was stirred at 25° C. for 3 hours, then, 98 g of methyl isobutyl ketone and 124 g of ion-exchange water were added, and a separation of layer was conducted. The resulting organic layer was washed with 124 g of ion-exchanged water twice, followed by conducting a separation of layers. The solvent was distilled off from this organic layer for concentration. Then, a solvent substitution was carried out by adding 396 g of propylene glycol monomethyl ether acetate and distilling off the solvent to obtain 152 g of a resin solution of propylene glycol monomethyl ether acetate.

The concentration of solid components of the resin solution, measured by an evaporation method, was 33.3%. The ratio of the hydroxyl groups which had been 1-ethoxyethylated to the total hydroxyl groups in poly(p-vinylphenol) (protecting ratio) was measured by nuclear magnetic resonance (NMR) and it was 38%. This resin contains structural units of the following formula, and is called Resin R8.

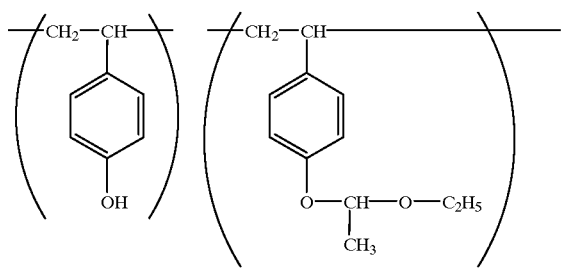

APPLICATION EXAMPLE 1

A propylene glycol monomethyl ether acetate solution of Resin R1 synthesized in Synthesis Example 1 in an amount of 9.1 parts in terms of solid components in the resin, a propylene glycol monomethyl ether acetate solution of Resin R8 synthesized in Synthesis Example 8 in an amount of 4.4 parts in terms of solid components in the resin, bis(cyclohexylsulfonyl)diazomethane as an acid generating agent in an amount of 0.5 parts, methyldioctylamine in an amount of 0.011 parts, and propylene glycol monomethyl ether acetate were mixed so that the total amount of propylene glycol monomethyl ether acetate was 65 parts, and dissolved. This solution was filtered through a filter made of a fluorine resin having a pore diameter of 0.1 $\mu$m, to prepare resist solution.

The above-described resist solution was applied on a silicon water which had been washed by a normal method so that the film thickness after drying was 0.72 $\mu$m using a spin coater. Then, this silicon wafer was prebaked for 90 seconds at 90° C. on a hotplate. The film after the prebaking was exposed through a chromium mask having pattern to a ultra violet ray using KrF eximer laser stepper [NSR-2205 EX12B manufactured by Nikon Corp., NA=0.55, σ=0.8] having a exposure wavelength of 248 nm with a changing of the exposure amount stepwise. The wafer after the exposure was heated for 90 seconds at 100° C. on a hot plate as PEB, for conducting a reaction for removing the protecting group in exposed portions. This was the developed with a 2.38% aqueous solution of tetramethylammonium hydroxide to obtain a positive pattern.

The formed pattern was observed by an electron microscope to find that a 0.18 $\mu$m fine pattern was resolved with excellent profile at an exposure of 35 mJ/cm². In this case, 35 mJ/cm² corresponds to an exposure amount (effective sensitivity) wherein 0.25 $\mu$m line and space pattern is 1:1, and 0.18 $\mu$m corresponds to the minimum size (resolution) of line and space separating at an exposure of the effective sensitivity. This resist was applied on a glass wafer, and transmittance of a light having wavelength of 248 nm through the resist in the form of a film was measured to find the transmittance per 1 $\mu$m of the resist film was 28%.

APPLICATION EXAMPLES 2 to 7 AND COMPARATIVE EXAMPLE 1

The same tests were conducted as the Application Example 1 except that resins shown in Table 1 were used in respective amounts instead of Resin R1 and Resin R8 used in Application Example 1, organic bases shown in Table 1 were used in respective amounts instead of methyldioctylamine used in Application Example 1. Further, 1.4 parts of phenyl benzoate was used in Comparative Example 1 so that the transmittance thereof became the same level as that of Application Examples, since a resist of Comparative Example 1 but containing no phenyl benzoate had high transmittance. Therefore, phenyl benzoate was added to this resist. The results obtained in these examples are shown in Table 1. "B1" and "B2" in the column of "Organic Base" in Table 1 indicate the following compounds.

B1: methyldioctylamine

B2: tris[2-(2-methoxyethoxy)ethyl]amine

In Application Examples 2 to 7, fine patterns having sizes shown in the column of "Resolution" in Table 1 were resolved with excellent profile at exposures shown in the column of "Effective Sensitivity". However, in Comparative Example 1, though 0.30 $\mu$m fine pattern was resolved at an exposure of 30 mJ/cm², the film reduction on pattern top was large and only root portions remained

TABLE 1

| | Resin (solid components-parts) | Organic base (parts) | Phenyl benzoate (parts) | Effective Sensitivity (mJ/cm²) | Resolution ($\mu$m) | Transmittance (*1) |
|---|---|---|---|---|---|---|
| Application Example 1 | R1/9.1 R8/4.4 | B1/0.011 | — | 35 | 0.18 | 28 |
| Application Example 2 | R2/13.5 | B2/0.012 | — | 29 | 0.21 | 23 |
| Application Example 3 | R3/8.1 R8/5.4 | B2/0.012 | — | 20 | 0.21 | 23 |
| Application Example 4 | R4/12.9 R8/0.6 | B2/0.013 | — | 28 | 0.20 | 27 |
| Application Example 5 | R5/7.7 R8/5.8 | B2/0.012 | — | 22 | 0.20 | 28 |
| Application Example 6 | R612.9/ R8/0.6 | B2/0.013 | — | 31 | 0.19 | 33 |
| Application Example 7 | R7/13.5 | B2/0.013 | — | 28 | 0.20 | 44 |
| Comparative example 1 | R8/13.5 | B1/0.012 | 1.4 | 30 (**2) | 0.30 | 28 |

*1: Transmittance per 1 $\mu$m of resist film
**2: Film reduction on pattern top was large By inclusion of a resin having a structural unit represented by the formula (I) into a photoresist, transparency can be controlled and a fine photoresist pattern having high accuracy can be formed which manifests excellent resolution and excellent profile even when transmittance is lowered. A resin having structural units represented by the formulas (I) and (II) is particularly useful for such object.

What we claim is:

1. A photoresist composition which comprises a resin having a structural unit represented by the following formula (I):

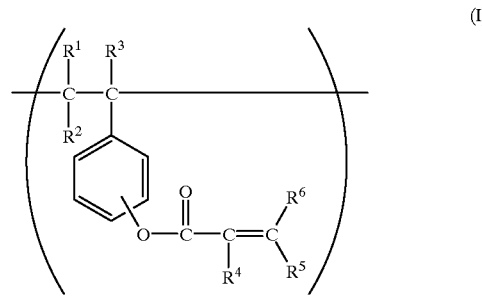

wherein $R^1$, $R^2$ and $R^3$ each independently represents a hydrogen atom or an alkyl group having 1 to 4 carbon atoms, $R^4$ represents a hydrogen atom, an alkyl group having 1 to 4 carbon atoms or an alkoxy group having 1 to 4 carbon atoms and $R^5$ represents a hydrogen atom, alkyl group or aryl group, or $R^4$ or $R^5$ join together to form a ring, which may be heterocyclic; and $R^6$ represents a hydrogen atom, an alkyl group having 1 to 4 carbon atoms, an alkoxy group having 1 to 4 carbon atoms or a hydroxyl group, and a structural unit represented by the following formula (V):

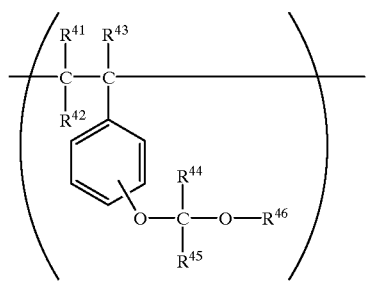

(V)

wherein $R^{41}$, $R^{42}$, $R^{43}$, and $R^{44}$ each independently represents a hydrogen atom or an alkyl group having 1 to 4 carbon atoms, $R^{45}$ represents an alkyl group having 1 to 4 carbon atoms, $R^{46}$ represents an alkyl group or cycloalkyl group, or $R^{45}$ and $R^{46}$ join together to from an alkylene chain, which alkylene chain may be optionally substituted with an alkoxy group.

2. The photoresist composition according to claim 1 wherein the resin is a copolymer containing structural units represented by formula (I) in an amount of from about 1 to 30 mol % of the total structural units of the copolymer.

3. The photoresist composition according to claim 1 wherein the structural unit represented by formula (I) is further represented by the following formula (Ia):

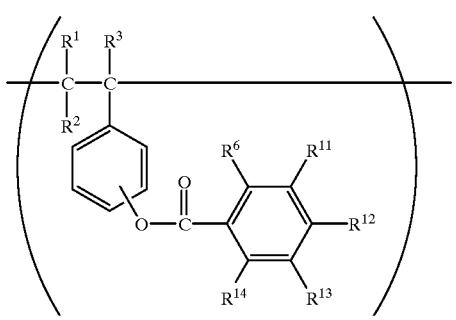

(Ia)

wherein $R^1$, $R^2$, $R^3$ and $R^6$ are as defined in formula (I), and $R^{11}$, $R^{12}$, $R^{13}$ and $R^{14}$ each independently represents a hydrogen atom, an alkyl group having 1 to 4 carbon atoms, an alkoxy group having 1 to 4 carbon atoms or a hydroxyl group.

4. The photoresist composition according to claim 1 wherein the structural unit represented by formula (I) is further represented by the following formula (Ic):

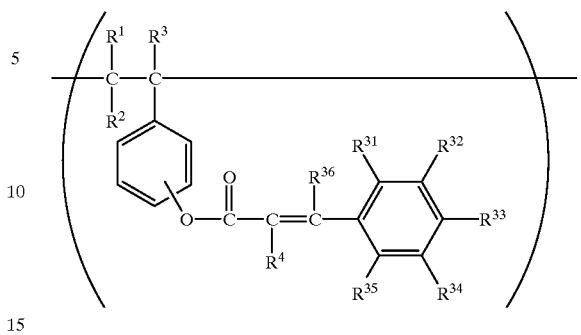

(Ic)

wherein $R^1$, $R^2$, $R^3$ and $R^4$ are as defined in formula (I), and $R^{31}$, $R^{32}$, $R^{33}$, $R^{34}$ and $R^{35}$ each independently represents a hydrogen atom, an alkyl group having 1 to 4 carbon atoms, an alkoxy group having 1 to 4 carbon atoms or a hydroxyl group, and $R^{36}$ represents a hydrogen atom or an alkyl group having 1 to 4 carbon atoms.

5. The photoresist composition according to claim 1 which comprises an acid generating agent in addition to the resin.

6. The photoresist composition according to claim 1 wherein the resin contains structural units represented by formula (V) in an amount of about 10 to 50% by mol of the total structural units of the copolymer.

7. The photoresist composition according to claim 1 wherein the resin contains a structural unit represented by the following formula (VI):

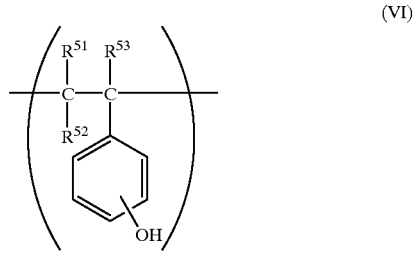

(VI)

wherein $R^{51}$, $R^{52}$ and $R^{53}$ each independently represents a hydrogen atom or an alkyl group having 1 to 4 carbon atoms in addition to the structural units of formula (I) and (V).

8. The photoresist composition according to claim 1, which comprises, in addition to the resin containing a structural unit of formula (I), a resin which is insoluble or poorly soluble in an alkali but which becomes alkali-soluble with the action of an acid.

9. The photoresist composition according to claim 1 which further comprises an organic base compound.

10. A photoresist composition which comprises a resin having a structural unit represented by the following formula (Ib):

(Ib)

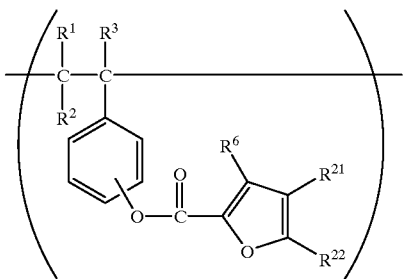

wherein $R^1$, $R^2$ and $R^3$ each independently represents a hydrogen atom or an alkyl group having 1 to 4 carbon atoms; $R^6$ represents a hydrogen atom, an alkyl group having 1 to 4 carbon atoms, an alkoxy group having 1 to 4 carbon atoms or a hydroxyl group; and $R^{21}$ and $R^{22}$ each independently represents a hydrogen atom, an alkyl group having 1 to 4 carbon atoms, an alkoxy group having 1 to 4 carbon atoms or a hydroxyl group; and a structural unit represented by the following formula (V):

(V)

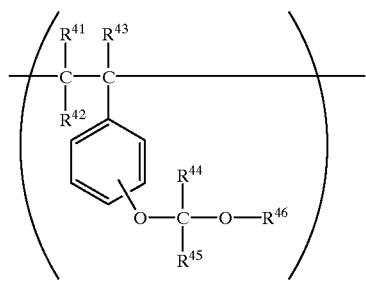

wherein $R^{41}$, $R^{42}$, $R^{43}$ and $R^{44}$ each independently represents a hydrogen atom or an alkyl group having 1 to 4 carbon atoms, $R^{45}$ represents an alkyl an alkyl group having 1 to 4 carbon atoms, $R^{46}$ represents an alkyl group or cycloalkyl group, or $R^{45}$ and $R^{46}$ join together to form an alkylene chain, which alkylene chain may be optionally substituted with an alkoxy group.

11. A resin which contains a structural unit represented by the following formula (Ia):

(Ia)

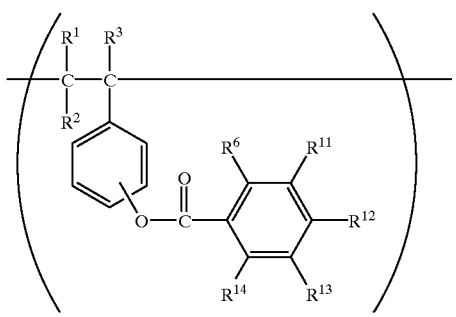

wherein $R^1$, $R^2$ and $R^3$ each independently represents a hydrogen atom or an alkyl group having 1 to 4 carbon atoms or an alkoxy group having 1 to 4 carbon atoms; $R^4$ represents a hydrogen atom, an alkyl group having 1 to 4 carbon atoms and $R^5$ represents a hydrogen atom, alkyl group or aryl group, or $R^4$ or $R^5$ join together to form a ring, which may be heterocyclic; and $R^6$ represents a hydrogen atom, an alkyl group having 1 to 4 carbon atoms, an alkoxy group having 1 to 4 carbon atoms or a hydroxyl group, and $R^{11}$, $R^{12}$, $R^{13}$ and $R^{14}$ each independently represents a hydrogen atom, an alkyl group having 1 to 4 carbon atoms, an alkoxy group having 1 to 4 carbon atoms or hydroxyl group and a structural unit represented by the following formula (V):

(V)

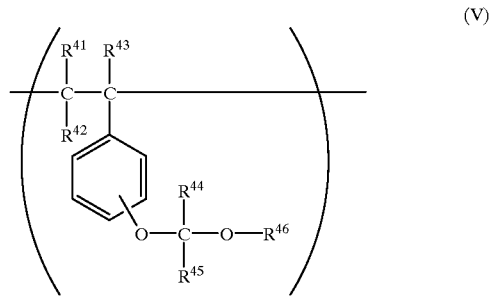

wherein $R^{41}$, $R^{42}$, $R^{43}$, and $R^{44}$ each independently represents a hydrogen atom or an alkyl group having 1 to 4 carbon atoms, $R^{45}$ represents an alkyl group having 1 to 4 carbon atoms, $R^{46}$ represents an alkyl group or cycloalkyl group, or $R^{45}$ and $R^{46}$ join together to from an alkylene chain, which alkylene chain may be optionally substituted with an alkoxy group.

12. A resin which contains structural units represented by the following formula (Ib):

(Ib)

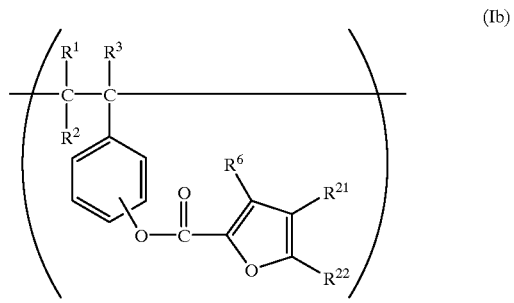

wherein $R^1$, $R^2$ and $R^3$ each independently represents a hydrogen atom or an alkyl group having 1 to 4 carbon atoms; ($R^4$ represents a hydrogen atom, an alkyl group having 1 to 4 carbon atoms or an alkoxy group having 1 to 4 carbon atoms and $R^5$ represents a hydrogen atom, alkyl group or aryl group, or $R^4$ and $R^5$ join together to form a ring, which may be heterocyclic; and $R^6$ represents a hydrogen atom, an alkyl group having 1 to 4 carbon atoms, an alkoxy group having 1 to 4 carbon atoms or a hydroxyl group, and $R^{21}$ and $R^{22}$ each independently represents a hydrogen atom, an alkyl group having 1 to 4 carbon atoms, an alkoxy group having 1 to 4 carbon atoms or hydroxyl group; and structural units represented by the following formula (V):

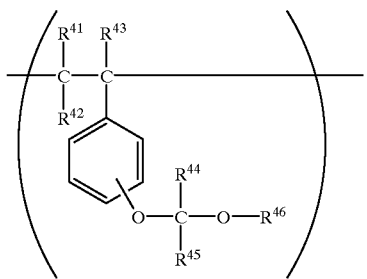

wherein $R^{41}$, $R^{42}$, $R^{43}$ and $R^{44}$ each independently represents a hydrogen atom or an alkyl group having 1 to 4 carbon atoms, $R^{45}$ represents an alkyl group having 1 to 4 carbon atoms, $R^{46}$ represents an alkyl group or cycloalkyl group, or $R^{45}$ and $R^{46}$ join together to form an alkylene chain, which alkylene chain may be optionally substituted with an alkoxy group.

13. A resin which contains a structural units represented by the following formula (Ic):

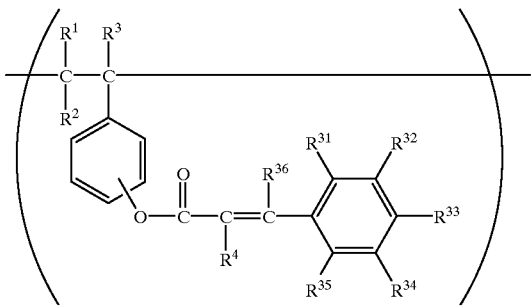

wherein $R^1$, $R^2$ and $R^3$ each independently represents a hydrogen atom or an alkyl group having 1 to 4 carbon atoms; $R^4$ represents a hydrogen atom, an alkyl group having 1 to 4 carbon atoms or an alkoxy group having 1 to 4 carbon atoms, and $R^5$ represents a hydrogen atom, alkyl group or aryl group, or $R^4$ or $R^5$ join together to form a ring, which may be heterocyclic; and $R^6$ represents a hydrogen atom, an alkyl group having 1 to 4 carbon atoms, an alkoxy group having 1 to 4 carbon atoms or a hydroxyl group, and $R^{31}$, $R^{32}$, $R^{33}$, $R^{34}$ and $R^{35}$ each independently represents a hydrogen atom, an alkyl group having 1 to 4 carbon atoms, an alkoxy group having 1 to 4 carbon atoms or hydroxyl group, and $R^{36}$ represents a hydrogen atom or an alkyl group having 1 to 4 carbon atoms and a structural unit represented by the following formula (V):

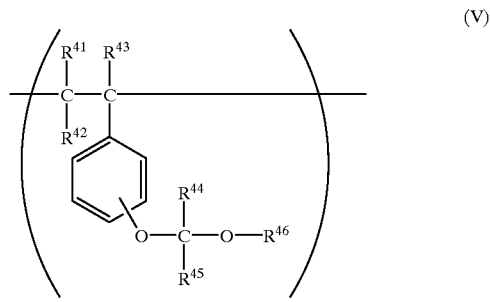

wherein $R^{41}$, $R^{42}$, $R^{43}$, and $R^{44}$ each independently represents a hydrogen atom or an alkyl group having 1 to 4 carbon atoms, $R^{45}$ represents an alkyl group having 1 to 4 carbon atoms, $R^{46}$ represents an alkyl group or cycloalkyl group, or $R^{45}$ and $R^{46}$ join together to from an alkylene chain, which alkylene chain may be optionally substituted with an alkoxy group.

* * * * *